United States Patent
Ohta et al.

(10) Patent No.: US 9,837,596 B2
(45) Date of Patent: Dec. 5, 2017

(54) PIEZOELECTRIC DEVICE, PIEZOELECTRIC ACTUATOR, PIEZOELECTRIC SENSOR, HARD DISK DRIVE, AND INKJET PRINTER APPARATUS

(71) Applicant: TDK CORPORATION, Tokyo (JP)

(72) Inventors: Ryu Ohta, Tokyo (JP); Hitoshi Sakuma, Tokyo (JP); Yuiko Hirose, Tokyo (JP)

(73) Assignee: TDK CORPORATION, Tokyo (JP)

( * ) Notice: Subject to any disclaimer, the term of this patent is extended or adjusted under 35 U.S.C. 154(b) by 447 days.

(21) Appl. No.: 14/304,460

(22) Filed: Jun. 13, 2014

(65) Prior Publication Data
US 2015/0364670 A1    Dec. 17, 2015

(51) Int. Cl.
*H01L 41/18* (2006.01)
*H01L 41/08* (2006.01)
(Continued)

(52) U.S. Cl.
CPC ...... *H01L 41/0805* (2013.01); *H01L 41/1873* (2013.01); *H01L 41/0973* (2013.01); *H01L 41/316* (2013.01)

(58) Field of Classification Search
CPC ..... H01L 41/187; H01L 41/18; H01L 41/085; H01L 41/1873; H01L 41/0973; H01L 41/316
(Continued)

(56) References Cited

U.S. PATENT DOCUMENTS 6,093,338 A * 7/2000 Tani .................. C04B 35/462
                                                    252/62.9 PZ
7,701,121 B2    4/2010 Oka et al.
(Continued)

FOREIGN PATENT DOCUMENTS

EP          2 006 263 A1    12/2008
JP          A-2008-263132   10/2008
(Continued)

OTHER PUBLICATIONS

S. H. Baek et al., "Giant Piezoelectricity on Si for Hyperactive MEMS," Science, 334, 958 (2011), 958-961.
(Continued)

*Primary Examiner* — Bryan Gordon
(74) *Attorney, Agent, or Firm* — Oliff PLC

(57) ABSTRACT

A piezoelectric element exhibiting a small leakage current density and high reliability as compared with a KNN thin film piezoelectric element in the related art is provided. The piezoelectric element is characterized by including a lower electrode, a piezoelectric layer primarily made from potassium-sodium niobate, which is a perovskite type compound represented by a general formula $ABO_3$, and an upper electrode, wherein the piezoelectric layer is present between the lower electrode and the upper electrode, and the piezoelectric layer has the value determined by dividing the maximum value of intensity of a diffraction peak, where the angle of $2\theta$ is within the range of $21.1° \leq 2\theta \leq 23.4°$ in the X-ray diffraction pattern ($2\theta/\theta$), by the intensity of a diffraction peak, where $2\theta$ is within the range of $30.1° \leq 2\theta \leq 33.3°$, of 0.04 or less.

7 Claims, 8 Drawing Sheets

(51) Int. Cl.
*H01L 41/187* (2006.01)
*H01L 41/09* (2006.01)
*H01L 41/316* (2013.01)

(58) Field of Classification Search
USPC .................................................. 310/358, 360
See application file for complete search history.

(56) References Cited

U.S. PATENT DOCUMENTS

| | | | |
|---|---|---|---|
| 7,838,453 B2 | 11/2010 | Katayama et al. | |
| 7,884,531 B2 | 2/2011 | Shibata et al. | |
| 8,035,281 B2 | 10/2011 | Shibata et al. | |
| 8,450,911 B2 | 5/2013 | Shibata et al. | |
| 2003/0227234 A1* | 12/2003 | Namerikawa | H01L 41/094 310/358 |
| 2009/0189482 A1* | 7/2009 | Shibata | G01C 19/5663 310/311 |
| 2009/0189490 A1 | 7/2009 | Shibata et al. | |
| 2009/0230211 A1* | 9/2009 | Kobayashi | B41J 2/161 239/102.2 |
| 2009/0273652 A1* | 11/2009 | Kazama | B41J 2/14233 347/68 |
| 2010/0103226 A1* | 4/2010 | Sakashita | B41J 2/14233 347/68 |
| 2011/0006643 A1* | 1/2011 | Shibata | H01L 41/094 310/357 |
| 2011/0074251 A1 | 3/2011 | Shibata et al. | |
| 2011/0121690 A1* | 5/2011 | Shibata | C04B 35/495 310/363 |
| 2011/0221831 A1* | 9/2011 | Yonemura | B41J 2/055 347/68 |

FOREIGN PATENT DOCUMENTS

| | | |
|---|---|---|
| JP | A-2009-200468 | 9/2009 |
| JP | A-2011-109037 | 6/2011 |

OTHER PUBLICATIONS

Xiaoqing Wu et al., "Preparation and Properties of (110) Oriented Lead-Free Sodium Potassium Niobate Thin Films by MOD Method," Ferroelectrics, 367 (2008), 61-66.
Nov. 23, 2015 extended European Search Report issued in Application No. 15171917.6.

* cited by examiner

PIEZOELECTRIC DEVICE, PIEZOELECTRIC ACTUATOR, PIEZOELECTRIC SENSOR, HARD DISK DRIVE, AND INKJET PRINTER APPARATUS

BACKGROUND OF INVENTION

Field of Invention

The present invention relates to a piezoelectric element, a piezoelectric actuator including the piezoelectric element, and a piezoelectric sensor, and a hard disk drive provided with the piezoelectric actuator and an ink-jet printer device. In particular, the piezoelectric element relates to a piezoelectric element including a piezoelectric layer.

Background Art

As for utilization of piezoelectric materials, instead of bulk piezoelectric materials, commercialization of a piezoelectric element by using a thin film piezoelectric material has proceeded. Examples include a gyro sensor, a shock sensor, and the like taking advantage of a piezoelectric effect, in which a force applied to a piezoelectric layer is converted to a voltage, and an actuator, an ink-jet print head, a speaker, a buzzer, a resonator, and the like taking advantage of an inverse piezoelectric effect, in which a piezoelectric layer is deformed when a voltage is applied to the piezoelectric layer.

In the case where a piezoelectric material is made into a thin film, miniaturization of an element becomes possible, applicable fields are expanded and, in addition, mass productivity increases because many elements can be produced on a substrate in one operation. Furthermore, there are many advantages in performances, for example, the sensitivity is improved in the case where a sensor is produced.

Piezoelectric constants d31 and e31 are mentioned as indicators of the use of piezoelectric materials. It is said that as the absolute values of these values increase, better piezoelectric effect and inverse piezoelectric effect are exhibited.

The reliability of the piezoelectric material tends to increase as the insulating property increases. A leakage current density is mentioned as the indicator to exhibit the insulating property. It can be said that as the leakage current density is low, the insulating property is high.

Also, in many cases, previously known piezoelectric materials typified by lead zirconate titanate (PZT) contains lead. Development of a piezoelectric material free from lead has been desired from the viewpoint of an environmental issue.

[PTL 1] Japanese Unexamined Patent Application Publication No. 2011-109037

[PTL 2] Japanese Unexamined Patent Application Publication No. 2009-200468

[NPL 1] S. H. Baek et al.: Science 334 (2011) 958

[NPL 2] X. Wu et al.: Ferroelectrics 367 (2008) 61

SUMMARY OF INVENTION

NPL 1 reports that good piezoelectricity is obtained by forming a thin film of lead based piezoelectric material $Pb(Mg_{1/3}Nb_{2/3})O_3$—$PbTiO_3$ (PMN-PT) on a $SrRuO_3$ thin film. However, it is preferable to utilize a lead-free material in practice in consideration of the environment.

PTL 1 reports that good piezoelectric characteristics are obtained by reducing the leakage current density of a lead-free piezoelectric material potassium-sodium niobate ($(K,Na)NbO_3$ (hereafter may be referred to as KNN)) thin film. However, reduction in productivity and yield due to disturbance in the crystallinity with respect to the electrode interface is feared.

PTL 2 reports that in order to obtain good piezoelectric characteristics with the KNN thin film, the orientation rate of (001) face orientation is specified to be 80% or more and, thereby, the piezoelectric constant |d31|≥80 pm/v at an applied electric field of 30 kV/cm is obtained. However, reduction in the reliability and an increase in the leakage current due to the movement of domain are feared because the direction of the spontaneous polarization of the unit lattice intrinsic to KNN is not parallel to the applied voltage direction.

PTL 2 reports that a KNN thin film having large (110) orientation intensity is formed on a Pt film oriented in the (111) orientation by using the MOD method. However, an increase in the leakage current due to disturbance in crystal is feared because the diffraction intensity of the (001) face is large.

The present invention has been made in consideration of the problems included in the above-described related art and it is an object to provide a piezoelectric element which is a piezoelectric element including a KNN thin film and exhibiting high productivity and a small leakage current density.

The fact that the leakage current density of the piezoelectric element is small refers to that the reliability is enhanced. Therefore, the piezoelectric element on the basis of a piezoelectric effect can be applied to the use of, for example, a sensor which does not cause a failure easily and a piezoelectric element on the basis of an inverse piezoelectric effect can be applied to the use of, for example, an actuator which exhibits high durability.

In order to achieve the above-described object, a piezoelectric element according to the present invention is characterized by including a lower electrode, a piezoelectric layer made from potassium-sodium niobate, which is a perovskite type compound represented by a general formula $ABO_3$, and an upper electrode, wherein the above-described piezoelectric layer is present between the above-described lower electrode and the above-described upper electrode, and the above-described piezoelectric layer has the value determined by dividing the maximum value of intensity of a diffraction peak, where the angle of 2θ is within the range of 21.1°≤2θ≤23.4° in the X-ray diffraction pattern (2θ/θ), by the intensity of a diffraction peak, where 2θ is within the range of 30.1°≤2θ≤33.3°, of 0.04 or less.

As for diffraction peaks of the piezoelectric layer made from potassium-sodium niobate in the X-ray diffraction pattern (2θ/θ), a peak, where the angle of 2θ is within the range of 21.1°≤2θ≤23.4°, is specified to be a diffraction peak attributed to the {001} face in a psuedo-cubic crystal and a peak, where the angle of 2θ is within the range of 30.1°≤2θ≤33.3°, is specified to be a diffraction peak attributed to the {110} face in a psuedo-cubic crystal. The peak is identified referring to Bragg diffraction condition represented by the following equation, $$2d \sin \theta = n\lambda$$

where d: lattice spacing, θ: angle formed by incident X-ray and lattice plane, λ: wavelength of incident X-ray (0.15418 nm), and n: integer.

Here, the {001} face refers to any one of the (001) face, the (010) face, and the (100) face. Likewise, the {110} face refers to any one of the (110) face, the (101) face, and the (011) face.

In the piezoelectric layer of the piezoelectric element according to the present invention, as the diffraction intensity attributed to the {001} face is small, a leakage current of the piezoelectric layer because of restriction of the lower electrode by a lattice is reduced and highly reliable good piezoelectric characteristics can be obtained.

Also, in the case of {110} preferred orientation, an electric field can be applied parallel to the {110} direction which is the direction of spontaneous polarization of the unit lattice of the piezoelectric layer. Consequently, movements of domains and crystal grains due to application of the voltage are reduced, a leakage current is reduced, and highly reliable good piezoelectric characteristics can be obtained.

In the piezoelectric layer, if the value determined by dividing the maximum value of intensity of a diffraction peak attributed to the {001} face, where the angle of 2θ of the diffraction peak is within the range of $21.1°≤2θ≤23.4°$ in the X-ray diffraction pattern (2θ/θ), by the intensity of a diffraction peak attributed to the {110} face, where 2θ is within the range of $30.1°≤2θ≤33.3°$, is more than 0.04, the stress of the piezoelectric layer may be increased because of an increase in misfit between the lattice constant of the lower electrode and the lattice of the piezoelectric layer and cracking may occur in the piezoelectric layer. Furthermore, the direction of spontaneous polarization of the unit lattice of the piezoelectric layer is not parallel to the direction of the applied electric field, so that movements of domains and crystal grains increase, an increase in the leakage current is led, and reduction in the reliability is caused.

In this regard, in the piezoelectric layer of the piezoelectric element according to the present invention, the value determined by dividing the maximum value of intensity of a diffraction peak, where the angle of 2θ is within the range of $21.1°≤2θ23.4°$ in the X-ray diffraction pattern (2θ/θ), by the intensity of a diffraction peak attributed to the {110} face, where 2θ is within the range of $30.1°≤2θ≤33.3°$ has no lower limit and is preferably close to 0, that is, the piezoelectric layer is formed from only a lattice exhibiting a diffraction peak attributed to the {110} face.

Also, in the piezoelectric element according to the present invention, the above-described lower electrode can be made from an electrically conductive substance oriented in the {001} face and be in contact with the above-described piezoelectric layer. A stress generated at the interface between the piezoelectric layer and the lower electrode is reduced by employing this configuration, and the reliability of the piezoelectric element is improved. Here, examples of electrically conductive substances include Pt (platinum), Ni (nickel), Al (aluminum), Cu (copper), Mo (molybdenum), Ir (iridium), $SrRuO_3$, $LaNiO_3$, and $Pt_{0.8}Ir_{0.2}$.

Among them, it is preferable that platinum be used as the electrically conductive substance of the lower electrode. Consequently, an electric field can be applied to the piezoelectric layer efficiently.

Also, this piezoelectric layer may contain at least one type of additive selected from Li (lithium), Ta (tantalum), Sr (strontium), Ba (barium), Zr (zirconium), Mn (manganese), Sb (antimony), and Bi (bismuth) in accordance with various purposes.

In general, it is believed to be effective to form an orientation control layer prior to formation of the piezoelectric layer in order to form a piezoelectric layer having a high orientation property. However, in formation of the piezoelectric element in the piezoelectric element according to the present invention, the piezoelectric layer having high orientation property and exhibiting excellent piezoelectric characteristics is obtained without using the orientation control layer to control the orientation of the piezoelectric layer. Therefore, the steps can be simplified and the material cost can be reduced.

A piezoelectric actuator according to the present invention includes the piezoelectric element represented by the above-described configuration. Specific examples of piezoelectric actuators include head assemblies of hard disk drives and piezoelectric actuators of ink-jet printer heads.

Also, a piezoelectric sensor according to the present invention includes the piezoelectric element represented by the above-described configuration. Specific examples of piezoelectric sensors include gyro sensors, pressure sensors, and pulse wave sensors.

Also, a hard disk drive and an ink-jet printer device according to the present invention include the above-described piezoelectric actuator.

The piezoelectric element according to the present invention can improve the piezoelectric characteristics and the reliability as compared with the piezoelectric element by using the KNN thin film in the related art. Likewise, the piezoelectric characteristics and the reliability of the piezoelectric actuator and the piezoelectric sensor according to the present invention can be improved and high-performance hard disk drive and ink-jet printer device can be provided.

DESCRIPTION OF PREFERRED EMBODIMENTS

Figure 1:
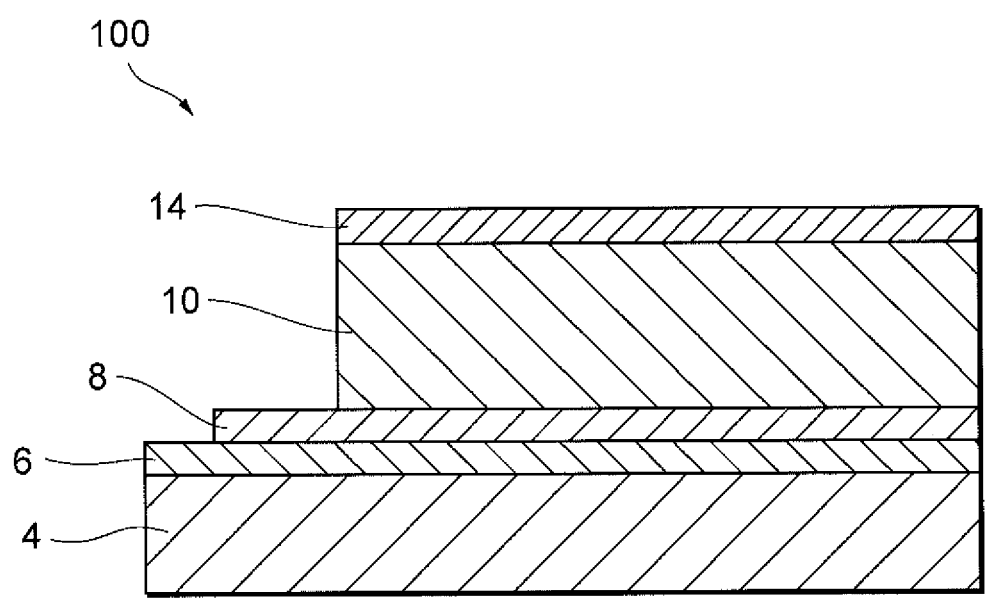
FIG. 1 is a configuration diagram of a piezoelectric element according to a first embodiment of the present invention.

A preferred embodiment according to the present invention will be described below in detail with reference to the drawings. In this regard, in the drawings, the same or equivalent members are indicated by the same reference numerals. Meanwhile, vertical and horizontal relationships between positions are as shown in the drawing. In this connection, the same explanations will not be provided.

(Piezoelectric Element)

FIG. 1 shows a piezoelectric element 100 according to the present embodiment. The piezoelectric element 100 includes a substrate 4, an oxide layer 6 and a lower electrode 8 disposed on the substrate 4, and a piezoelectric layer 10 and an upper electrode 14 disposed on the lower electrode 8.

A silicon substrate, a MgO substrate, a $SrTiO_3$ substrate, or the like can also be used as the substrate 4. The substrate 4 has, for example, a thickness of 50 μm or more and 1,000 μm or less.

As for the insulating layer 6, $ZrO_2$, $Y_2O_3$, YSZ (7 percent by mole $Y_2O_3$—$ZrO_2$), MgO, $LaNiO_3$, $SrRuO_3$, $BaTiO_3$, $SrTiO_3$, or the like can be used. The oxide layer 6 can be formed by a sputtering method, a vacuum evaporation method, a thermal oxidation method, a printing method, a spin coating method, a sol-gel method, or the like. The oxide layer 6 has, for example, a thickness of 5 nm or more and 1,000 nm or less. In the case where an oxide substrate, e.g., a MgO substrate or a $SrTiO_3$ substrate, is used as the substrate 4, the oxide layer 6 may not be provided.

Examples of materials usable as the lower electrode 8 include at least one selected from Pt (platinum), Ni (nickel), Al (aluminum), Cu (copper), Mo (molybdenum), Ir (iridium), $SrRuO_3$, $LaNiO_3$, $Pt_{0.8}Ir_{0.2}$, and the like and combinations of a plurality of them. The lower electrode 8 can be formed by the sputtering method, the vacuum evaporation method, or the like. For example, in the case where Pt is used, a Pt electrode oriented in the {001} face orientation can be obtained. The lower electrode 8 has a thickness of, for example, 0.01 μm or more and 1.0 μm or less.

The lower electrode 8 can be subjected to a surface treatment, e.g., ashing by using oxygen plasma and etching by using argon plasma. Consequently, the surface state of the lower electrode 8 is changed and a good piezoelectric layer 10 can be formed.

The piezoelectric layer 10 is made from potassium-sodium niobate, which is a perovskite type compound represented by a general formula $ABO_3$, and can be formed by the sputtering method, the vacuum evaporation method, the printing method, the spin coating method, the sol-gel method, or the like.

This piezoelectric layer 10 may contain at least one type of additive selected from Li (lithium), Ta (tantalum), Sr (strontium), Ba (barium), Zr (zirconium), Mn (manganese), Sb (antimony), and Bi (bismuth). Consequently, the piezoelectric characteristics of the element can be further enhanced.

The film thickness of the piezoelectric layer 10 is not specifically limited and can be, for example, about 0.5 to 10 μm.

Figure 2:
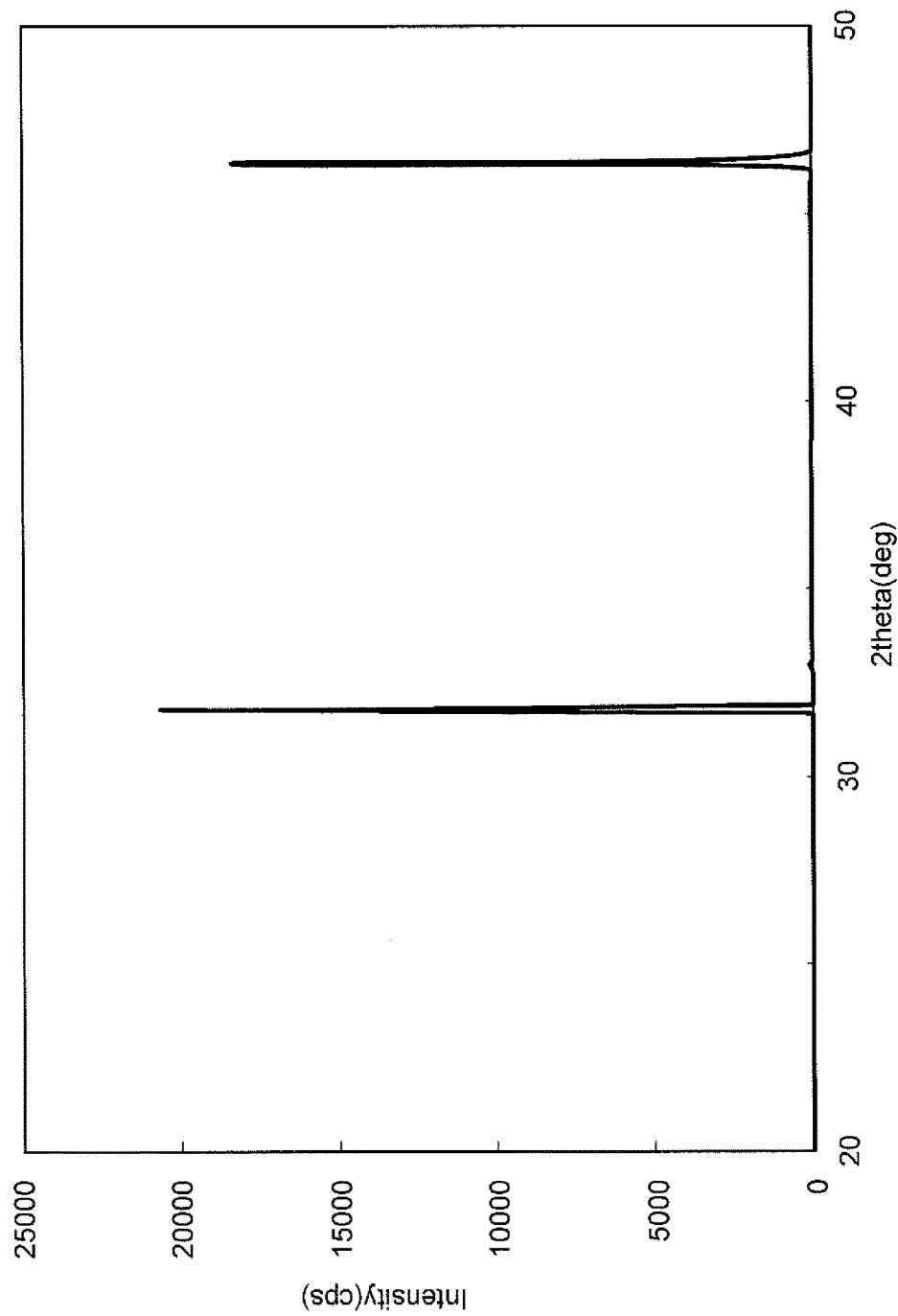
FIG. 2 shows an X-ray diffraction pattern (2θ/θ) of a piezoelectric layer and a lower electrode in the piezoelectric element according to the present invention.

When this piezoelectric layer 10 is subjected to the X-ray diffraction pattern (2θ/θ) measurement, the value determined by dividing the maximum value of intensity of a diffraction peak attributed to the (001) face in a psuedo-cubic crystal, where the angle of 2θ is within the range of $21.1°≤2θ≤23.4°$, by the intensity of a diffraction peak attributed to the {110} face in a psuedo-cubic crystal, where 2θ is within the range of $30.1°≤2θ≤33.3°$, is 0.04 or less. This indicates the preferred orientation of the piezoelectric layer 10 in the {110} face orientation. As an example of the result, FIG. 2 shows an X-ray diffraction pattern (2θ/θ) of the piezoelectric layer 10 and the lower electrode 8 in the piezoelectric element 100 according to the present invention. In FIG. 2, the value determined by dividing the maximum value of intensity, where the angle of 2θ is within the range of $21.1°≤2θ≤23.4°$, by the intensity of a diffraction peak attributed to the (110) face, where 2θ is within the range of $30.1°≤2θ≤33.3°$, is 0.0064.

In FIG. 2, the peak present within the range of $46.1°≤2θ≤46.7°$ is attributed to the (002) face of Pt (platinum). This indicates that platinum is oriented in the {001} face.

Examples of other methods for examining the orientation property of the piezoelectric layer 10 include a method in which the electron beam diffraction image of a sample is observed by using TEM (transmission electron microscope) or EBSD (electron backscatter diffraction method).

The upper electrode 14 is formed from, for example, Pt. The upper electrode 14 has a thickness of, for example, 0.02 μm or more and 1.0 μm or less. Also, a metal material, e.g., Pd (palladium), Rh (rhodium), Au (gold), Cu (copper), Ni (nickel), Ru (ruthenium), Ir (iridium), Mo, Ti (titanium), Ta (tantalum), or Al (aluminum), or an electrically conductive metal oxide, e.g., $SrRuO_3$ or $LaNiO_3$, can be used as the upper electrode 14. The upper electrode 14 can be formed by the sputtering method, the vacuum evaporation method, the printing method, the spin coating method, the sol-gel method, or the like.

After the upper electrode 14 is formed, a laminate including the piezoelectric layer 10 is patterned by photolithography and dry etching, wet etching, and the substrate 4 is subjected to cutting work, so that a piezoelectric element 100 having a movable part dimension of, for example, 5 mm×15 mm can be obtained.

In this regard, the substrate 4 and/or the oxide layer 6 may be removed from the piezoelectric element 100. Consequently, the displacement and the sensitivity of the piezoelectric element can be increased.

Also, the piezoelectric element 100 may be coated with a protective film. Consequently, the reliability can be further enhanced.

(Piezoelectric Actuator)

Figure 3A:
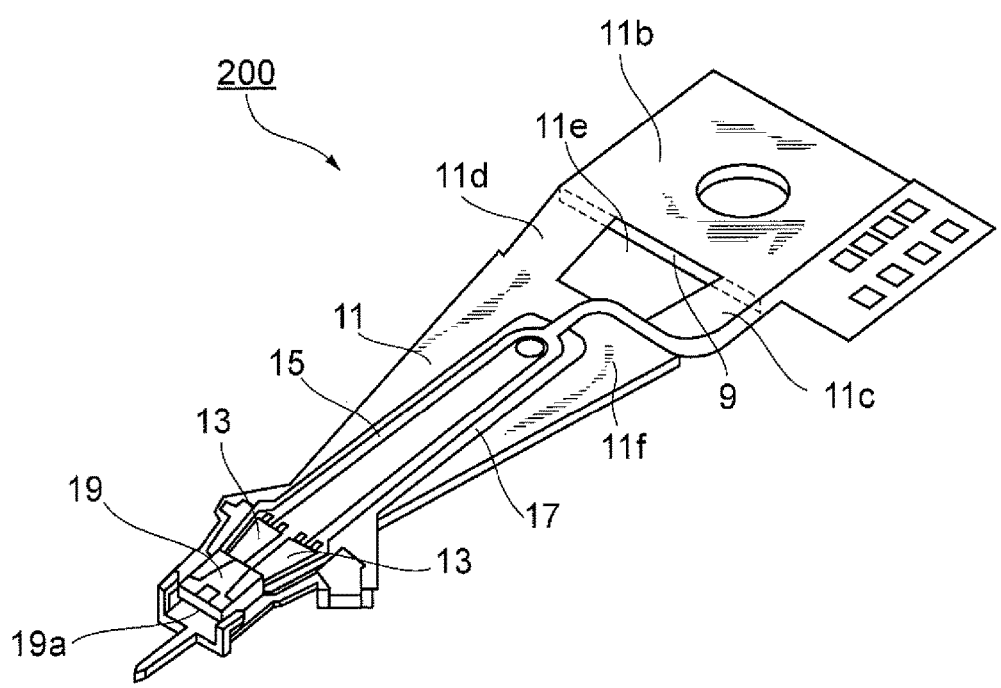
FIGS. 3A and 3B are structural diagrams of piezoelectric actuators according to the present invention.

FIG. 3A is a configuration diagram of a head assembly mounted on a hard disk drive (hereafter may be referred to as HDD) as an example of piezoelectric actuators including these piezoelectric elements. As shown in this drawing, a head assembly 200 includes a base plate 9, a load beam 11, a flexure 17, first and second piezoelectric elements 13 serving as driver elements, and a slider 19 provided with a head element 19a, as main constituents thereof.

In this regard, the load beam 11 includes a base end portion 11b fixed to the base plate 9 by beam welding or the like, first and second plate spring portions 11c and 11d extending from this base end portion lib while tapering, an opening portion 11e disposed between the first and second plate spring portions 11c and 11d, and a beam main portion 11f following the first and second plate spring portions 11c and 11d and extending linearly while tapering.

The first and second piezoelectric elements 13 are disposed on a wiring flexible substrate 15 which is part of the flexure 17, while keeping a predetermined distance from each other. The slider 19 is fixed to an end portion of the flexure 17 and is rotated in accordance with expansion and contraction of the first and second piezoelectric elements 13.

The first and second piezoelectric elements 13 are formed from a lower electrode, an upper electrode, and a piezoelectric layer sandwiched between the lower electrode and the upper electrode. The reliability can be enhanced by using the piezoelectric element exhibiting a small leakage current density as the piezoelectric element used for the piezoelectric actuator according to the present invention.

Figure 3B:
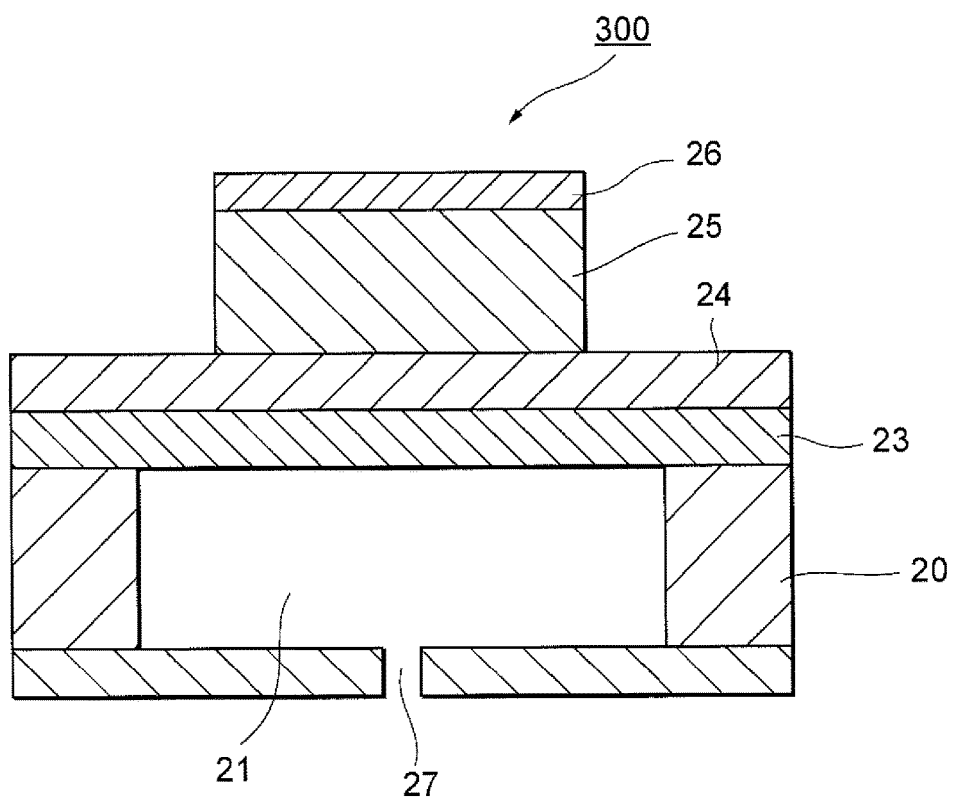

FIG. 3B is a configuration diagram of a piezoelectric actuator of an ink-jet printer head, as another example of the piezoelectric actuator including the above-described piezoelectric element.

A piezoelectric actuator 300 is formed by stacking an insulating film 23, a lower electrode 24, a piezoelectric layer 25, and an upper electrode 26 on a substrate 20.

In the case where a predetermined ejection signal is not supplied and a voltage is not applied between the lower electrode 24 and the upper electrode 26, deformation does not occur in the piezoelectric layer 25. A pressure change does not occur in a pressure chamber 21 provided with a piezoelectric element supplied with no ejection signal, and an ink droplet is not ejected from a nozzle 27 thereof.

On the other hand, in the case where a predetermined ejection signal is supplied and a certain voltage is applied between the lower electrode 24 and the upper electrode 26, deformation occurs in the piezoelectric layer 25. The insulating film 23 is bent to a great extent in a pressure chamber 21 provided with the piezoelectric element supplied with an ejection signal. Consequently, the pressure in the pressure chamber 21 increases instantaneously, and an ink droplet is ejected from the nozzle 27.

Here, the reliability can be enhanced by using the piezoelectric element exhibiting a small leakage current density as the piezoelectric element used for the piezoelectric actuator according to the present invention.

(Piezoelectric Sensor)

Figure 4A:
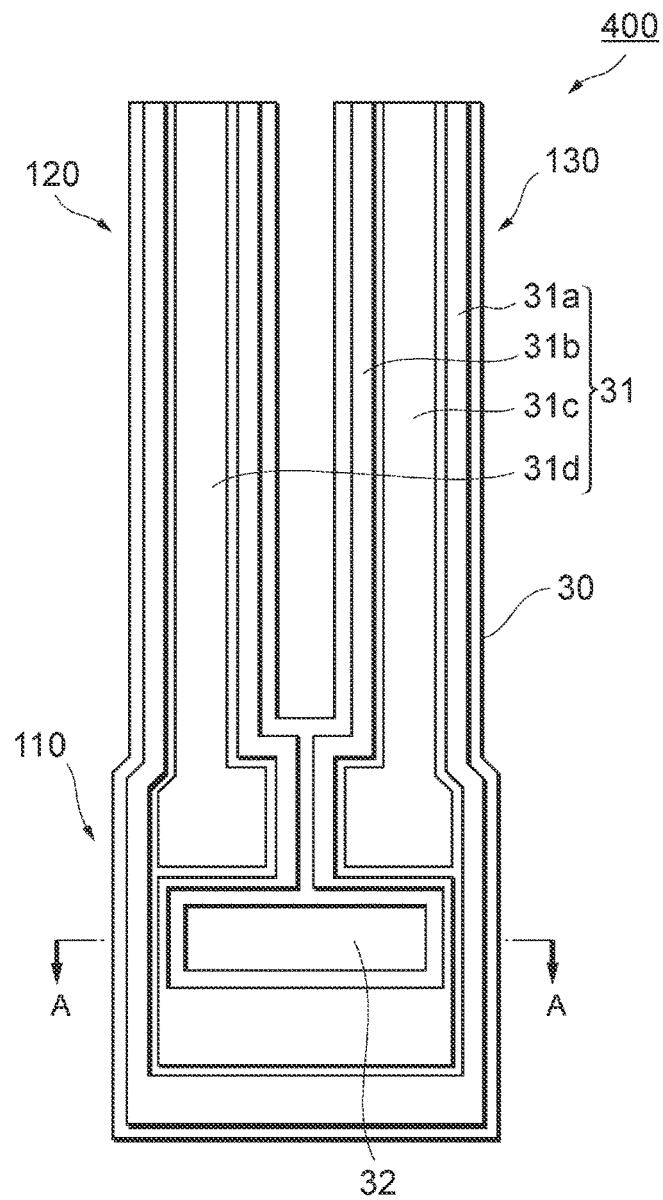
FIGS. 4A to 4D are structural diagrams of piezoelectric sensors according to the present invention.
Figure 4B:
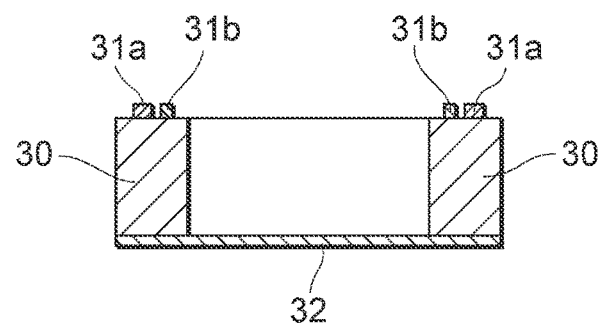

FIG. 4A is a configuration diagram (plan view) of a gyro sensor as an example of a piezoelectric sensor including the above-described piezoelectric element. FIG. 4B is a sectional view of the section taken along a line A-A shown in FIG. 4A.

A gyro sensor 400 is a tuning fork vibrator type angular velocity detecting element provided with a base portion 110 and two arms 120 and 130 connected to one surface of the base portion 110. This gyro sensor 400 is obtained by micromachining the piezoelectric layer 30, the upper electrode 31, and the lower electrode 32 constituting the above-described piezoelectric element to correspond with the shape of the tuning fork vibrator. The individual portions (base portion 110 and arms 120 and 130) are integrally formed by the piezoelectric element.

Each of drive electrode layers 31a and 31b and detection electrode layer 31d is disposed on a first principal surface of one arm 120. Likewise, each of drive electrode layers 31a and 31b and detection electrode layer 31c is disposed on a first principal surface of the other arm 130. Each of these electrode layers 31a, 31b, 31c, and 31d is obtained by etching the upper electrode 31 into a predetermined electrode shape.

Meanwhile, the lower electrode 32 disposed all over second principal surfaces (principal surface on the back side of the first principal surface) of the base portion 110 and the arms 120 and 130 functions as a ground electrode of the gyro sensor 400.

Here, the longitudinal direction of each of the arms 120 and 130 is specified to be a Z direction, and a plane including the principal surfaces of the two arms 120 and 130 is specified to be an XZ plane, so that an XYZ rectangular coordinate system is defined.

When a drive signal is supplied to the drive electrode layers 31a and 31b, the two arms 120 and 130 are excited in an in-plane vibration mode. The in-plane vibration mode refers to a vibration mode in which the two arms 120 and 130 are excited in a direction parallel to the principal surfaces of the two arms 120 and 130. For example, when one arm 120 is excited in a −X direction at a velocity V1, the other arm 130 is excited in a +X direction at a velocity V2.

In the case where rotation at an angular velocity ω is added to the gyro sensor 400 under this state while the axis of rotation is specified to be the Z axis, the Coriolis force is applied to each of the two arms 120 and 130 in a direction perpendicular to the direction of the vibration, and excitation occurs in an out-of-plane vibration mode. The out-of-plane vibration mode refers to a vibration mode in which the two arms 120 and 130 are excited in a direction orthogonal to the principal surfaces of the two arms 120 and 130. For example, when the Coriolis force F1 applied to one arm 120 is in a −Y direction, a Coriolis force F2 applied to the other arm 130 is in a +Y direction.

The magnitudes of the Coriolis forces F1 and F2 are proportionate to the angular velocity ω and, therefore, the angular velocity ω can be determined by converting mechanical strains of the arms 120 and 130 due to the Coriolis forces F1 and F2 to electric signals (detection signals) by the piezoelectric layer 30 and taking them from the detection electrode layers 31c and 31d.

Stable detection sensitivity can be obtained by using the piezoelectric element exhibiting a small leakage current density as the piezoelectric element used for the piezoelectric sensor according to the present invention.

Figure 4C:
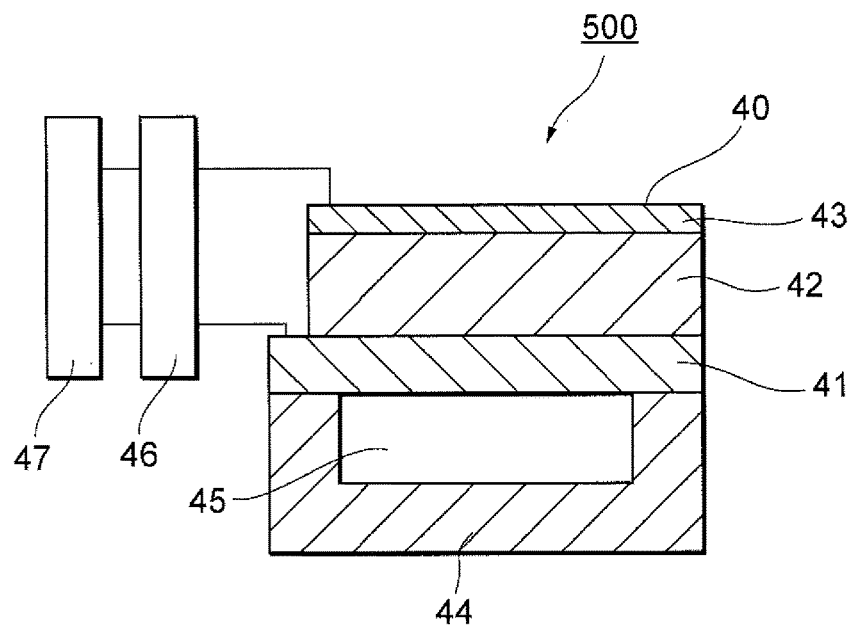

FIG. 4C is a configuration diagram of a pressure sensor as a second example of the piezoelectric sensor including the above-described piezoelectric element.

A pressure sensor 500 has a cavity 45 to respond to application of a pressure and, in addition, is formed from a support member 44 to support a piezoelectric element 40, a current amplifier 46, and a voltage measuring instrument 47. The piezoelectric element 40 includes a common electrode layer 41, a piezoelectric layer 42, and an individual electrode layer 43, which are stacked in that order on the support member 44. Here, when an external force is applied, the piezoelectric element 40 is bent and the voltage is detected by the voltage measuring instrument 47.

Stable detection sensitivity can be obtained by using the piezoelectric element exhibiting a small leakage current density as the piezoelectric element used for the piezoelectric sensor according to the present invention.

Figure 4D:
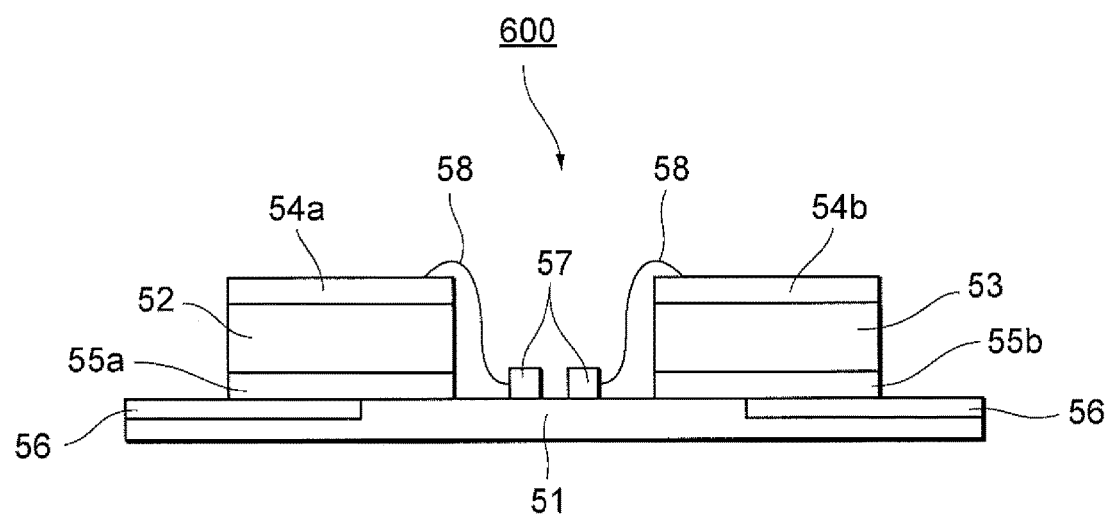

FIG. 4D is a configuration diagram of a pulse wave sensor as a third example of the piezoelectric sensor including the above-described piezoelectric element.

A pulse wave sensor 600 is configured to be equipped with a transmitting piezoelectric element and a receiving piezoelectric element on a substrate 51. Here, in the transmitting piezoelectric element, electrode layers 54a and 55a are disposed on the two surfaces of the transmitting piezoelectric layer 52 in the thickness direction, and in the receiving piezoelectric element, electrode layers 54b and 55b are also disposed on the two surfaces of the receiving piezoelectric layer 53 in the thickness direction. In addition, electrodes 56 and upper surface electrodes 57 are disposed on the substrate 51, where the electrode layers 54a and 54b are electrically connected to the upper surface electrodes 57, respectively, by wirings 58.

In order to detect pulses of a living body, initially, the substrate back surface (surface not equipped with the piezoelectric element) of the pulse wave sensor 600 is brought into contact with the living body. Then, when pulses are detected, a specific drive voltage signal is output to both the electrode layers 54a and 55a of the transmitting piezoelectric element. The transmitting piezoelectric element is excited in accordance with the drive voltage signal input into both the electrode layers 54a and 55a, so as to generate an ultrasonic wave and transmit the ultrasonic wave into the living body. The ultrasonic wave transmitted into the living body is reflected by a bloodstream and is received by the receiving piezoelectric element. The receiving piezoelectric element converts the received ultrasonic wave to a voltage signal and outputs from both the electrode layers 54b and 55b.

High reliability and stable detection sensitivity can be obtained by using the piezoelectric element exhibiting a small leakage current density as the piezoelectric element used for the piezoelectric sensor according to the present invention.

(Hard Disk Drive)

Figure 5:
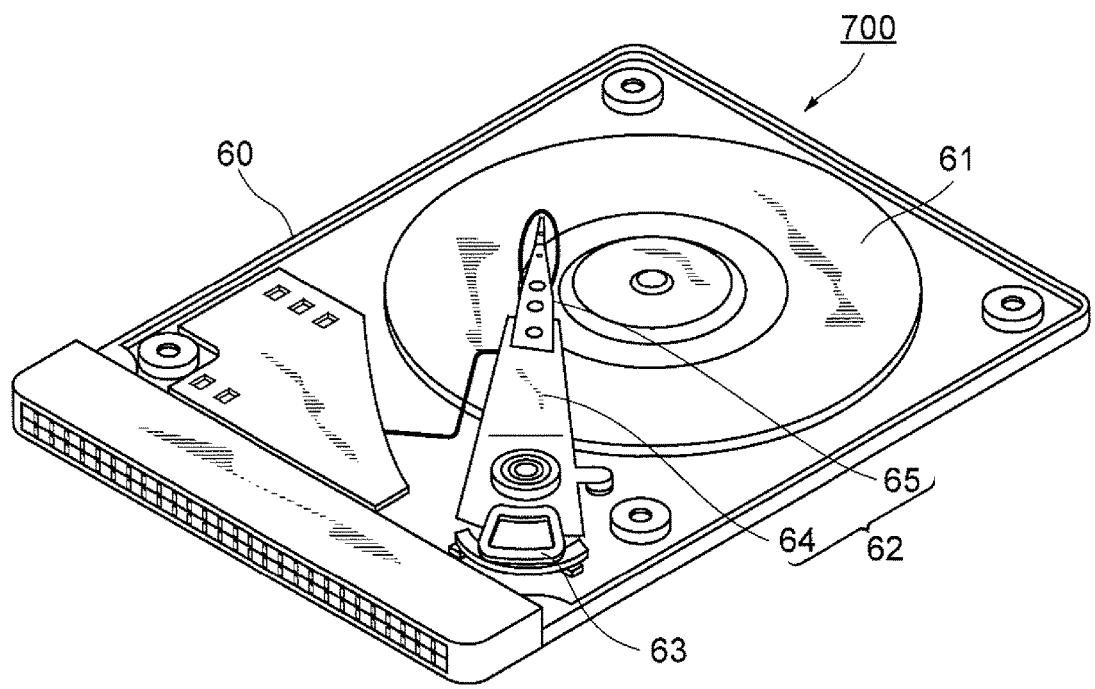
FIG. 5 is a structural diagram of a hard disk drive according to the present invention.

FIG. 5 is a configuration diagram of a hard disk drive equipped with the head assembly shown in FIG. 3A.

A hard disk drive 700 is provided with a hard disk 61 serving as a recording medium and a head stack assembly 62 to record the magnetic information thereto and regenerate in a housing 60. The hard disk 61 is rotated by a motor, although not shown in the drawing.

In the head stack assembly 62, a plurality of assemblies formed from an actuator arm 64 supported by a voice coil motor 63 in such a way as to rotate freely around a spindle and a head assembly 65 (200) connected to this actuator arm 64 are stacked in the depth direction in the drawing. The head slider 19 is attached to an end portion of the head assembly 65 in such a way as to opposite to the hard disk 61 (refer to FIG. 3A).

As for the head assembly 65, a form in which the head element 19*a* (refer to FIG. 3A) is fluctuated in two steps is adopted. Relatively large movements of the head element 19*a* are controlled by whole drive of the head assembly 65 and the actuator arm 64 on the basis of the voice coil motor 63, and fine movements are controlled by drive of the head slider 19 by the end portion of the head assembly 65.

High reliability and stable accessibility can be obtained by using the piezoelectric element exhibiting a small leakage current density as the piezoelectric element used for this head assembly 65.

(Ink Jet Printer Device)

Figure 6:
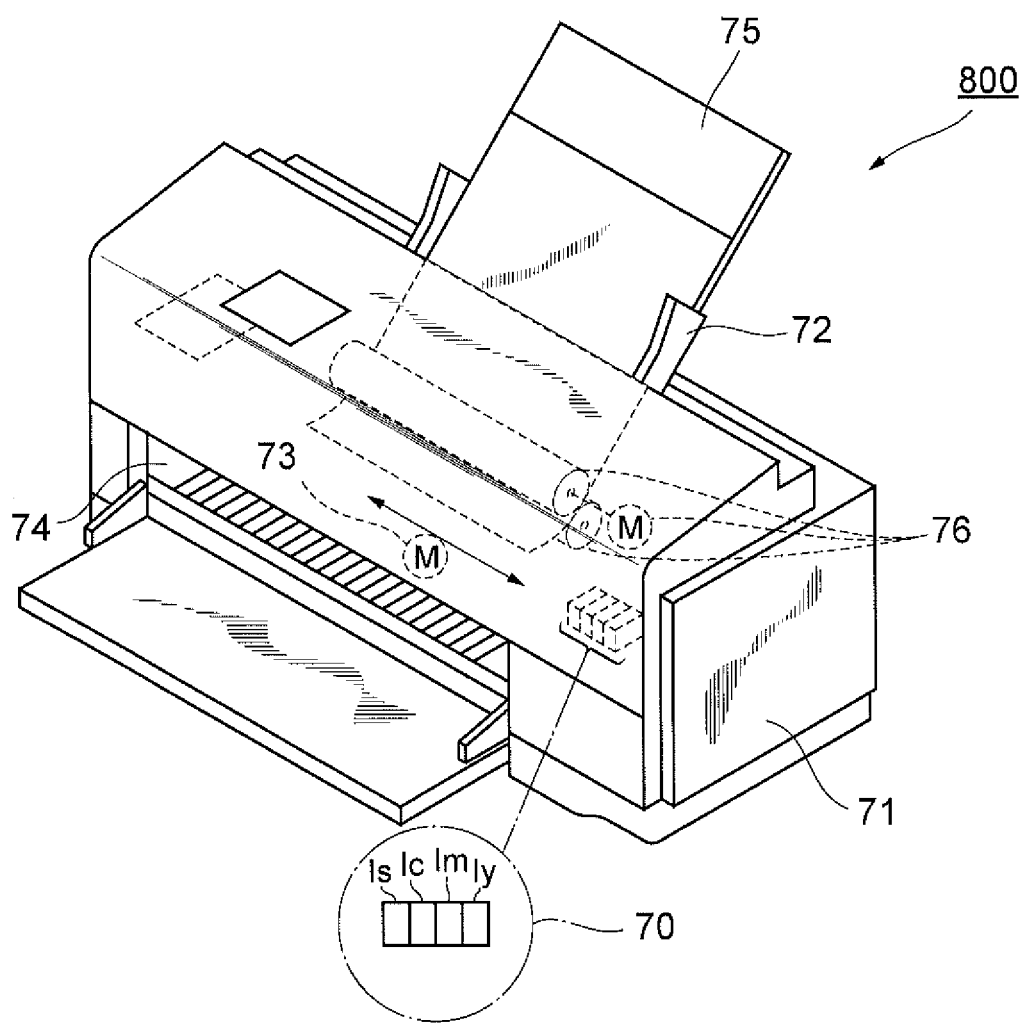
FIG. 6 is a structural diagram of an ink-jet printer device according to the present invention.

FIG. 6 is a configuration diagram of an ink-jet printer device equipped with the ink-jet printer head shown in FIG. 3B.

An ink-jet printer device 800 is configured to primarily include an ink-jet printer head 70, a main body 71, a tray 72, and a head drive mechanism 73. The piezoelectric actuator 300 is included in the ink-jet printer head 70.

The ink-jet printer device 800 is provided with ink cartridges of four colors of yellow, magenta, cyan, and black in total and is configured to be able to perform full color printing. In addition, this ink-jet printer device 800 is provided with an exclusive controller board and the like in the inside, and the ink ejection timing of the ink-jet printer head 70 and scanning of the head drive mechanism 73 are controlled. Meanwhile, the main body 71 is provided with the tray 72 on the back and is provided with an automatic sheet feeder (automatic continuous sheet feeding mechanism) 76 in the inside, so as to automatically send recording paper 75 and deliver the recording paper 75 from a front-mounted delivery port 74.

An ink-jet printer device exhibiting high reliability and high safety can be provided by using the piezoelectric element exhibiting a small leakage current density as the piezoelectric element used for the piezoelectric actuator of this ink-jet printer head 70.

For example, the piezoelectric element according to the present invention can be used for applications, e.g., a gyro sensor, a shock sensor, and a microphone, taking advantage of a piezoelectric effect and applications, e.g., an actuator, an ink-jet head, a speaker, a buzzer, and a resonator, taking advantage of an inverse piezoelectric effect, and is particularly suitable for applications taking advantage of the inverse piezoelectric effect.

Up to this point, preferred embodiments of the piezoelectric element and the like according to the present invention have been explained in detail. However, the present invention is not limited to the above-described embodiments. An application employed on the basis of ferroelectricity, which is a subordinate concept of the piezoelectricity, is also included in the piezoelectric element according to the present invention.

EXAMPLES

The present invention will be more specifically described below with reference to the examples and the comparative examples. However, the present invention is not limited to the following examples.

(Production of Piezoelectric Element and Measurement of Orientation Property)

Example 1

In the present example, a term "base member" refers to a member to be provided with a film in each step.

A silicon wafer (substrate 4) which exhibited (100) face orientation and which had a diameter of 3 inches was placed in a vacuum chamber of a vacuum evaporation apparatus, and evacuation was performed. Thereafter, a film of YSZ (7 percent by mole $Y_2O_3$—$ZrO_2$) was formed as an oxide layer 6 and a film of Pt was formed as a lower electrode 8. The base member temperature in film formation was specified to be 900° C. as for YSZ and 700° C. as for Pt. The thickness of the oxide layer 6 was specified to be 10 nm and the thickness of the lower electrode 8 was specified to be 200 nm.

After the film of the lower electrode 8 was formed, an out-of-plane XRD (X-ray diffraction) measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that Pt was oriented in the {001} face orientation.

Subsequently, the base member was transferred to an etching chamber and the surface of the lower electrode 8 was etched three times with argon ions. The electric power to ionize the argon gas at this time was specified to be 20 W at the first time, 100 W at the second time, and 20 W at the third time. The etching time was specified to be 25 seconds at each of the first, second, and third times. Thereafter, the surface of the lower electrode 8 was subjected to ashing for 60 seconds with oxygen plasma.

Then, the base member was transferred to a chamber of a RF sputtering apparatus equipped with a plurality of sputtering targets, evacuation was performed and, thereafter, a potassium-sodium niobate thin film was formed as a piezoelectric layer 10. As for the sputtering target, a potassium-sodium niobate sintered material containing 1 percent by mole of Mn (manganese) was used. The base member temperature in film formation was specified to be 950° C. and the thickness of the piezoelectric layer 10 was specified to be 3,200 nm.

After the piezoelectric layer 10 was formed, an XRD measurement was performed to examine the orientation property of the piezoelectric layer 10 in a direction perpendicular to the plane. The result was the XRD pattern as shown in FIG. 2. In the present example, it was shown that the value determined by dividing the maximum value of intensity of a diffraction peak attributed to the {001} face, where the angle of 2θ was within the range of 21.1°≤2θ≤23.4°, by the intensity of a diffraction peak attributed to the {110} face, where 2θ is within the range of 30.1°≤2θ≤33.3°, was 0.0064 and was 0.04 or less. In this regard, in FIG. 2, the peak present within the range of 46.1°≤2θ≤46.7° was attributed to the (002) face of Pt (platinum). This indicates that platinum was oriented in the {001} face.

Thereafter, the base member was transferred again to another chamber of the RF sputtering apparatus, evacuation was performed and, then, a film of Pt was formed as an upper electrode 14. The base member temperature in film formation was specified to be 200° C. and the thickness of the upper electrode 14 was specified to be 200 nm.

After the upper electrode 14 was formed, a laminate including the piezoelectric layer 10 was patterned by photolithography and dry etching, wet etching, and the wafer was subjected to cutting work, so as to obtain a piezoelectric element 100 having a movable part dimension of 5 mm×15 mm.

Example 2

In Example 1, after the film of the lower electrode was formed, the base material was transferred to another chamber of the RF sputtering apparatus without applying ashing and etching, and evacuation was performed. Then, a potassium-sodium niobate thin film was formed as a piezoelectric layer. As for the sputtering target, a potassium-sodium niobate sintered material containing 0.8 percent by mole of Mn was used. The base member temperature in film formation was specified to be 950° C. and the thickness of the piezoelectric layer was specified to be 3,200 nm. Examination of the orientation property of the piezoelectric layer and production of the piezoelectric element were performed in the same manner as that in Example 1.

Example 3

A MgO substrate (substrate 4) which exhibited (100) face orientation and which had a size of 15 mm×15 mm×0.5 mm was placed in a vacuum chamber of a RF sputtering apparatus, and a film of Pt was formed as a lower electrode 8. The base member temperature in film formation was specified to be 700° C. The thickness of the lower electrode 8 was specified to be 200 nm.

After the film of the lower electrode 8 was formed, the out-of-plane XRD measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that Pt was oriented in the (002) face orientation. This indicates that platinum was oriented in the {001} face.

Subsequently, the surface of the base member was subjected to ashing for 60 seconds with oxygen plasma. Thereafter, the base member was transferred to an etching chamber and the surface of the lower electrode 8 was etched three times with argon ions. The electric power to ionize the argon gas at this time was specified to be 20 W at the first time, 50 W at the second time, and 20 W at the third time. The etching time was specified to be 25 seconds at each of the first, second, and third times. Then, ashing was performed again for 60 seconds with oxygen plasma.

Subsequently, the base member was transferred to a chamber of a RF sputtering apparatus equipped with a plurality of sputtering targets, evacuation was performed and, thereafter, a potassium-sodium niobate thin film was formed as a piezoelectric layer 10. As for the sputtering target, a potassium-sodium niobate sintered material containing 1 percent by mole of Mn was used. The base member temperature in film formation was specified to be 950° C. and the thickness of the piezoelectric layer 10 was specified to be 3,200 nm. Examination of the orientation property of the piezoelectric layer 10 and production of the piezoelectric element 100 were performed in the same manner as that in Example 1.

Example 4

A MgO substrate (substrate 4) which exhibited (110) face orientation and which had a size of 15 mm×15 mm×0.5 mm was placed in a vacuum chamber of a RF sputtering apparatus, and a film of Pt was formed as a lower electrode 8. The base member temperature in film formation was specified to be 700° C. The thickness of the lower electrode 8 was specified to be 200 nm.

After the film of the lower electrode 8 was formed, the out-of-plane XRD measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that Pt was oriented in the {110} face orientation.

Thereafter, the base member was transferred to an etching chamber and the surface of the lower electrode 8 was etched three times with argon ions. The electric power to ionize the argon gas at this time was specified to be 50 W at the first time, 55 W at the second time, and 50 W at the third time. The etching time was specified to be 25 seconds at each of the first, second, and third times.

Subsequently, the base member was transferred to a chamber of a RF sputtering apparatus equipped with a plurality of sputtering targets, evacuation was performed and, thereafter, a potassium-sodium niobate thin film was formed as a piezoelectric layer 10. As for the sputtering target, a potassium-sodium niobate sintered material containing 1 percent by mole of Mn was used. The base member temperature in film formation was specified to be 950° C. and the thickness of the piezoelectric layer 10 was specified to be 3,200 nm. Examination of the orientation property of the piezoelectric layer 10 and production of the piezoelectric element 100 were performed in the same manner as that in Example 1.

Example 5

A $LaAlO_3$ substrate (substrate 4) which exhibited (100) face orientation and which had a size of 15 mm×15 mm×0.5 mm was placed in a vacuum chamber of a RF sputtering apparatus, and a film of $LaNiO_3$ was formed as a lower electrode 8. The base member temperature in film formation was specified to be 700° C. The thickness of the lower electrode 8 was specified to be 120 nm.

After the film of the lower electrode 8 was formed, the out-of-plane XRD measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that the lower electrode 8 was oriented in the {001} face.

Subsequently, the surface of the base member was subjected to ashing for 60 seconds with oxygen plasma. Thereafter, the base member was transferred to an etching chamber and the surface of the lower electrode 8 was etched three times with argon ions. The electric power to ionize the argon gas at this time was specified to be 100 W at the first time, 40 W at the second time, and 10 W at the third time. The etching time was specified to be 25 seconds at each of the first, second, and third times. Then, ashing was performed again for 60 seconds with oxygen plasma.

A potassium-sodium niobate thin film was formed as a piezoelectric layer 10. As for the sputtering target, a potassium-sodium niobate sintered material containing 0.5 percent by mole of Mn was used. The base member temperature in film formation was specified to be 750° C. and the thickness of the piezoelectric layer 10 was specified to be 3,200 nm. Examination of the orientation property of the piezoelectric layer 10 and production of the piezoelectric element 100 were performed in the same manner as that in Example 1.

Example 6

A silicon wafer (substrate 4) which was provided with a thermal oxidation film ($SiO_2$: oxide layer 6) and which had a diameter of 3 inches was placed in a vacuum chamber of a vacuum evaporation apparatus, and evacuation was performed. Then, a film of Ni was formed as a lower electrode 8. The base member temperature in film formation was specified to be 500° C. The thickness of the lower electrode 8 was specified to be 100 nm.

After the film of the lower electrode 8 was formed, the out-of-plane XRD measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that Ni did not have the orientation property.

Subsequently, the surface of the base member was subjected to ashing for 60 seconds with oxygen plasma. Thereafter, the base member was transferred to an etching chamber and the surface of the lower electrode 8 was etched three times with argon ions. The electric power to ionize the argon gas at this time was specified to be 20 W at the first time, 10 W at the second time, and 25 W at the third time. The etching time was specified to be 25 seconds at each of the first, second, and third times. Then, ashing was performed again for 60 seconds with oxygen plasma.

Subsequently, the base member was transferred to a chamber of a RF sputtering apparatus equipped with a plurality of sputtering targets, evacuation was performed and, thereafter, a potassium-sodium niobate thin film was formed as a piezoelectric layer 10. As for the sputtering target, a potassium-sodium niobate sintered material containing 1 percent by mole of Mn was used. The base member temperature in film formation was specified to be 950° C. and the thickness of the piezoelectric layer 10 was specified to be 3,200 nm. Examination of the orientation property of the piezoelectric layer 10 and production of the piezoelectric element 100 were performed in the same manner as that in Example 1.

Example 7

A silicon wafer (substrate 4) which was provided with a thermal oxidation film ($SiO_2$: oxide layer 6) and which had a diameter of 3 inches was placed in a vacuum chamber of a vacuum evaporation apparatus, and evacuation was performed. Then, a film of Pt was formed as a lower electrode 8. The base member temperature in film formation was specified to be 700° C. The thickness of the lower electrode 8 was specified to be 200 nm.

After the film of the lower electrode 8 was formed, the out-of-plane XRD measurement was performed to examine the orientation property of the lower electrode 8 in a direction perpendicular to the plane. The out-of-plane XRD measurement is divided into a symmetric reflection measurement (2θ/θ measurement) in which a lattice plane parallel to the sample surface is measured and an asymmetric reflection measurement in which a lattice plane obliquely intersecting the surface is measured. In the present example, the 2θ/θ measurement was performed. It was ascertained from the result of the 2θ/θ measurement that the lower electrode 8 was oriented in the (111) face.

Subsequently, the surface of the base member was subjected to ashing for 60 seconds with oxygen plasma. Thereafter, the base member was transferred to an etching chamber and the surface of the lower electrode 8 was etched three times with argon ions. The electric power to ionize the argon gas at this time was specified to be 10 W at the first time, 75 W at the second time, and 90 W at the third time. The etching time was specified to be 25 seconds at each of the first, second, and third times. Then, ashing was performed again for 60 seconds with oxygen plasma.

Subsequently, the base member was transferred to a chamber of a RF sputtering apparatus equipped with a plurality of sputtering targets, evacuation was performed and, thereafter, a potassium-sodium niobate thin film was formed as a piezoelectric layer 10. As for the sputtering target, a potassium-sodium niobate sintered material containing 0.7 percent by mole of Mn was used. The base member temperature in film formation was specified to be 950° C. and the thickness of the piezoelectric layer 10 was specified to be 3,200 nm. Examination of the orientation property of the piezoelectric layer 10 and production of the piezoelectric element 100 were performed in the same manner as that in Example 1.

Comparative Example 1

In Example 4, after the film of the lower electrode was formed, ashing was applied for 60 seconds with oxygen plasma and, then, etching by using argon ions was not performed.

The base member was transferred to another chamber of the RF sputtering apparatus, evacuation was performed and, thereafter, a potassium-sodium niobate thin film was formed as a piezoelectric layer. As for the sputtering target, a potassium-sodium niobate sintered material containing 0.1 percent by mole of Mn was used. The base member temperature in film formation was specified to be 950° C. and the thickness of the piezoelectric layer was specified to be 3,200 nm. Examination of the orientation property of the piezoelectric layer and production of the piezoelectric element were performed in the same manner as that in Example 1.

Comparative Example 2

In Example 6, after the film of the lower electrode was formed, the base member was transferred to an etching chamber without being subjected to ashing, and the surface of the lower electrode was etched three times with argon ions. The electric power to ionize the argon gas at this time was specified to be 50 W at the first time, 10 W at the second time, and 50 W at the third time. The etching time was specified to be 25 seconds at each of the first, second, and third times. Then, the surface of the lower electrode was not subjected to ashing with oxygen plasma.

The base member was transferred to another chamber of the RF sputtering apparatus, evacuation was performed and, thereafter, a potassium-sodium niobate thin film was formed as a piezoelectric layer. As for the sputtering target, a potassium-sodium niobate sintered material containing no additive was used. The base member temperature in film formation was specified to be 950° C. and the thickness of the piezoelectric layer was specified to be 3,200 nm.

Examination of the orientation property of the piezoelectric layer and production of the piezoelectric element were performed in the same manner as that in Example 1.

Comparative Example 3

In Example 7, after the surface of the base member was subjected to ashing for 60 seconds with oxygen plasma, the base member was transferred to an etching chamber and the surface of the lower electrode was etched three times with argon ions. The electric power to ionize the argon gas at this time was specified to be 50 W at the first time, 55 W at the second time, and 45 W at the third time. The etching time was specified to be 25 seconds at each of the first, second, and third times.

Subsequently, the base member was transferred to a chamber of a RF sputtering apparatus equipped with a plurality of sputtering targets, evacuation was performed and, thereafter, a potassium-sodium niobate thin film was formed as a piezoelectric layer. As for the sputtering target, a potassium-sodium niobate sintered material containing 0.7 percent by mole of Mn was used. The base member temperature in film formation was specified to be 950° C. and the thickness of the piezoelectric layer was specified to be 3,200 nm. Examination of the orientation property of the piezoelectric layer and production of the piezoelectric element were performed in the same manner as that in Example 1.

Comparative Example 4

In Example 7, the surface of the base member was not subjected to ashing with oxygen plasma nor etching with argon ions, the base member was transferred to a chamber of a RF sputtering apparatus equipped with a plurality of sputtering targets, evacuation was performed and, thereafter, a potassium-sodium niobate thin film was formed as a piezoelectric layer. As for the sputtering target, a potassium-sodium niobate sintered material containing 0.7 percent by mole of Mn was used. The base member temperature in film formation was specified to be 950° C. and the thickness of the piezoelectric layer was specified to be 3,200 nm. Examination of the orientation property of the piezoelectric layer and production of the piezoelectric element were performed in the same manner as that in Example 1.

(Evaluation of Piezoelectric Element)

The leakage current density of each of Examples 1 to 7 and Comparative examples 1 to 4 was evaluated by using a ferroelectric material evaluation system TF-1000 (produced by aixACCT Systems Gmbh). The applied voltage was specified to be 15 V, and the leakage current density obtained by the measurement is shown in Table 1. Here, the MgO substrate having the (100) face orientation in Example 3 is expressed as A-MgO and the MgO substrate having the (110) face orientation in Example 4 is expressed as B—MgO.

The values of piezoelectric layer crystal orientation ratios {001}/{110} of Examples 1 to 7 were small as compared with those of Comparative examples 1 to 4 and, in association with that, reduction in the leakage current density was able to be ascertained.

From comparisons between Examples 1 to 3 and 5 and Examples 4, 6, and 7, it was able to be ascertained that the leakage current density became smaller as the lower electrode 8 was in the {001} face orientation.

Also, from comparisons between Examples 1 to 3 and Example 5, it was able to be ascertained that the leakage current density became smaller as the lower electrode oriented in the {001} face orientation was Pt.

TABLE 1

| | Lower electrode/oxide layer/substrate or lower electrode/substrate | Lower electrode face orientation | Oxygen ashing after film formation of lower electrode | Lower electrode etching first time electric power (W) | Lower electrode etching second time electric power (W) | Lower electrode etching third time electric power (W) | Oxygen ashing after etching of lower electrode | Piezoelectric layer crystal orientation ratio {001}/{110} | Leakage current density (μA/cm²) |
|---|---|---|---|---|---|---|---|---|---|
| Example 1 | Pt/YSZ/Si | {001} | none | 20 | 100 | 20 | yes | $6.4 \times 10^{-3}$ | 0.04 |
| Example 2 | Pt/YSZ/Si | {001} | none | — | — | — | none | $9.2 \times 10^{-3}$ | 0.05 |
| Example 3 | Pt/A-MgO | {001} | yes | 20 | 50 | 20 | yes | $8.4 \times 10^{-3}$ | 0.05 |
| Example 4 | Pt/B-MgO | {110} | none | 50 | 55 | 50 | none | $3.5 \times 10^{-2}$ | 0.12 |
| Example 5 | LaNiO₃/LaAlO₃ | {001} | yes | 100 | 40 | 10 | yes | $2.1 \times 10^{-2}$ | 0.09 |
| Example 6 | Ni/SiO₂/Si | no orientation | yes | 20 | 10 | 25 | yes | $3.2 \times 10^{-2}$ | 0.17 |
| Example 7 | Pt/SiO₂/Si | {111} | yes | 10 | 75 | 90 | yes | $3.6 \times 10^{-2}$ | 0.14 |
| Comparative example 1 | Pt/B-MgO | {110} | yes | — | — | — | none | $9.0 \times 10^{-2}$ | 3.9 |
| Comparative example 2 | Ni/SiO₂/Si | no orientation | none | 50 | 10 | 50 | none | $2.3 \times 10^{-1}$ | 5.1 |

TABLE 1-continued

| | Lower electrode/oxide layer/substrate or lower electrode/substrate | Lower electrode face orientation | Oxygen ashing after film formation of lower electrode | Lower electrode etching first time electric power (W) | Lower electrode etching second time electric power (W) | Lower electrode etching third time electric power (W) | Oxygen ashing after etching of lower electrode | Piezoelectric layer crystal orientation ratio {001}/{110} | Leakage current density (μA/cm²) |
|---|---|---|---|---|---|---|---|---|---|
| Comparative example 3 | Pt/SiO₂/Si | {111} | yes | 50 | 55 | 45 | none | 5.3 × 10⁻¹ | 5.4 |
| Comparative example 4 | Pt/SiO₂/Si | {111} | none | — | — | — | none | 5.1 | 13.2 |

The invention claimed is:

1. A piezoelectric element comprising a lower electrode, a piezoelectric layer made from potassium-sodium niobate, which is a perovskite type compound represented by a general formula $ABO_3$, and an upper electrode,
wherein the piezoelectric layer is present between the lower electrode and the upper electrode, and
the piezoelectric layer has a characteristic such that the intensity of a diffraction peak, where the angle of 2θ is within the range of 21.1°≤2θ≤23.4° in the X-ray diffraction pattern (2θ/θ), divided by the intensity of a diffraction peak, where the angle of 2θ is within the range of 30.1°≤2θ≤33.3°, is 0.04 or less.

2. The piezoelectric element according to claim 1, wherein the lower electrode is made from an electrically conductive substance oriented in the {001} face orientation and is in contact with the piezoelectric layer.

3. The piezoelectric element according to claim 2, wherein the electrically conductive substance is platinum.

4. A piezoelectric actuator comprising the piezoelectric element according to claim 1.

5. A piezoelectric sensor comprising the piezoelectric element according to claim 1.

6. A hard disk drive comprising the piezoelectric actuator according to claim 4.

7. An ink-jet printer device comprising the piezoelectric actuator according to claim 4.

* * * * *